United States Patent

Malgouires

[11] Patent Number: 5,558,525
[45] Date of Patent: Sep. 24, 1996

[54] FRAME GROUND CONNECTION DEVICE FOR AUTOMATION EQUIPMENT

[75] Inventor: Pascal Malgouires, Cannes La Bocca, France

[73] Assignee: AEG Schneider Automation, Valbonne, France

[21] Appl. No.: 416,249

[22] Filed: Apr. 4, 1995

[30] Foreign Application Priority Data

Apr. 6, 1994 [FR] France .................................. 94 04134

[51] Int. Cl.⁶ .............................................. H01R 13/652
[52] U.S. Cl. ...................... 439/101; 174/35 GC; 361/818
[58] Field of Search ............................ 439/95, 101, 109; 361/753, 816–818; 174/35 GC

[56] References Cited

U.S. PATENT DOCUMENTS

| | | | |
|---|---|---|---|
| 4,760,214 | 7/1988 | Bienia et al. | 174/35 GC |
| 4,803,306 | 2/1989 | Malmquist | 174/35 GC |
| 4,889,959 | 12/1989 | Taylor et al. | 439/95 |
| 5,223,670 | 6/1993 | Hogan et al. | 361/818 |

FOREIGN PATENT DOCUMENTS

| | | |
|---|---|---|
| 0162373 | 11/1985 | European Pat. Off. . |
| 0351070 | 1/1990 | European Pat. Off. . |
| 2601277 | 7/1976 | Germany .......................... 174/35 GC |

*Primary Examiner*—Gary F. Paumen
*Attorney, Agent, or Firm*—Oblon, Spivak, McClelland, Maier & Neustadt, P.C.

[57] ABSTRACT

Automation equipment includes at least one removable interface module containing processor electronics on at least one printed circuit electrically connected to an interconnect printed circuit carried by a support via respective connectors. The printed circuit is accommodated in a casing of the module fixed to the support and electrically connected to a conductive part of the latter by a frame ground connection device which has connecting members fastened to the support and to the module, whereby mutual electrical contact is established between the module and the support. The connection members include a male member and a female member adapted to cooperate plug-and-socket fashion, and the interconnect printed circuit includes an opening through which at least one of the connecting members passes when the module is mounted on the support. This connecting member is insulated from the interconnect printed circuit where it passes through the opening.

5 Claims, 2 Drawing Sheets

FRAME GROUND CONNECTION DEVICE FOR AUTOMATION EQUIPMENT

BACKGROUND OF THE INVENTION

1. Field of the Invention

The present invention concerns a frame ground connecting device, for example a ground connection, for automation equipment such as a modular programmable automatic controller.

2. Description of the Prior Art

A programmable automatic controller includes one or more juxtaposed removable interface modules each containing, in a casing, processing electronics on one or more printed circuit cards which can be electrically connected to an interconnect printed circuit by respective connectors, the interconnect printed circuit being carried by a support and connecting the modules to each other and to a central processor unit. The housing can be fixed to the support and electrically connected to a conductive part of the latter by a frame ground connection device.

When the module is fixed to the support and connected to the interconnect bus it is preferable for a conductive part of the support and the module to be in mutual electrical contact to connect the printed circuits of the module to frame ground. When an operator mounts the module on the interconnect bus or demounts it, it is desirable for the frame ground connection to be made first or broken last, in order to protect the processor electronics.

This frame ground continuity of the module and the automatic controller and consequently grounding of the automatic controller, the conductive part of the support being connected to ground, are generally obtained by means of screws.

Another function of these screws is to fix the module to the support. Attaching a module by means of screws can take a relatively long time and requires the use of a tool.

For this reason the invention is directed to facilitating the mounting of the module on its support and to ensuring continuity of the frame ground connection during connection and disconnection of the circuits of the module and the interconnect printed circuit.

Consequently, the present invention concerns frame ground or ground connections for components of a module or connected to it.

SUMMARY OF THE INVENTION

The present invention consists in a frame ground connection device, for example a ground connection device, for automation equipment which includes at least one removable interface module containing processor electronics on at least one printed circuit adapted to be electrically connected to an interconnect printed circuit carried by a support via respective connectors, at least one printed circuit being accommodated in a casing of the module adapted to be fixed to the support and connected electrically to a conductive part of the latter by a frame ground connection device which has connecting members fastened to the support and to the module, whereby mutual electrical contact is established between the module and the support, in which device:

the connection members include a male member and a female member adapted to cooperate plug-and-socket fashion, and the interconnect printed circuit includes an opening through which at least one of the connecting members passes when the module is mounted on the support, the member being insulated from the interconnect printed circuit where it passes through the opening.

In accordance with one feature of the invention, the female connection member includes an elastic metal part accommodated in a blind cavity in a rigid metal nose member.

In accordance with another feature of the invention the housing of the module has a metal rear wall and the connection member fastened to the module is cast in one piece with the rear wall of the module.

In accordance with another feature of the invention the connection member fastened to the support is a finger member cast in one piece with the support.

In accordance with another feature of the invention the mutual distances between the active parts of the frame ground connection members and the connection members of the connectors are such that the frame ground connection is made first when connecting printed circuits of the module to the interconnect printed circuit and interrupted last on disconnecting them.

The following description with reference to the drawings shows the features and advantages of the invention.

DETAILED DESCRIPTION OF THE PREFERRED EMBODIMENT

Figure 1:
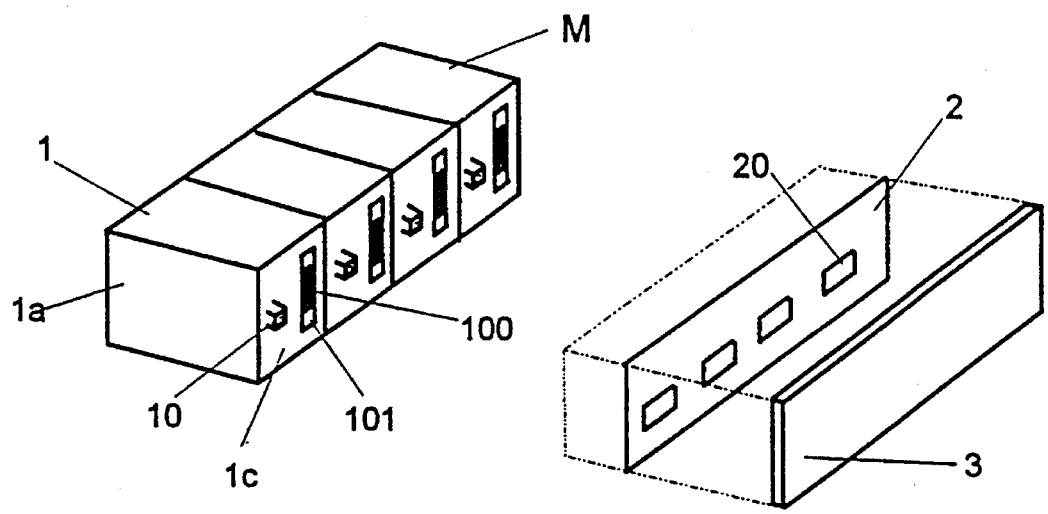
FIG. 1 is a perspective exploded rear view showing the panel, the interconnect printed circuit and the juxtaposed electronic modules of a programmable automatic controller.
Figure 2:
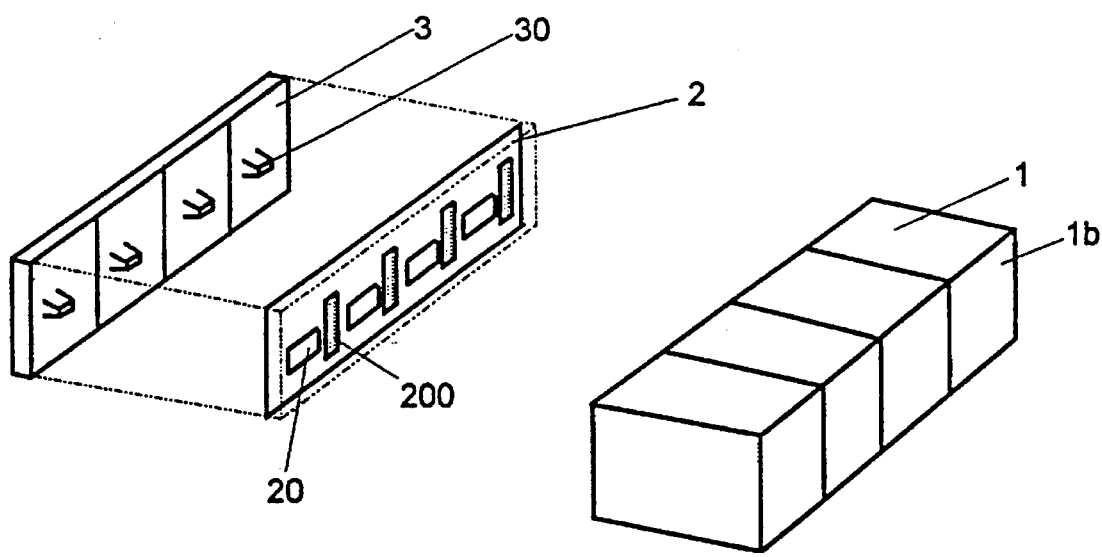
FIG. 2 is a perspective front view analogous to FIG. 1.
Figure 3:
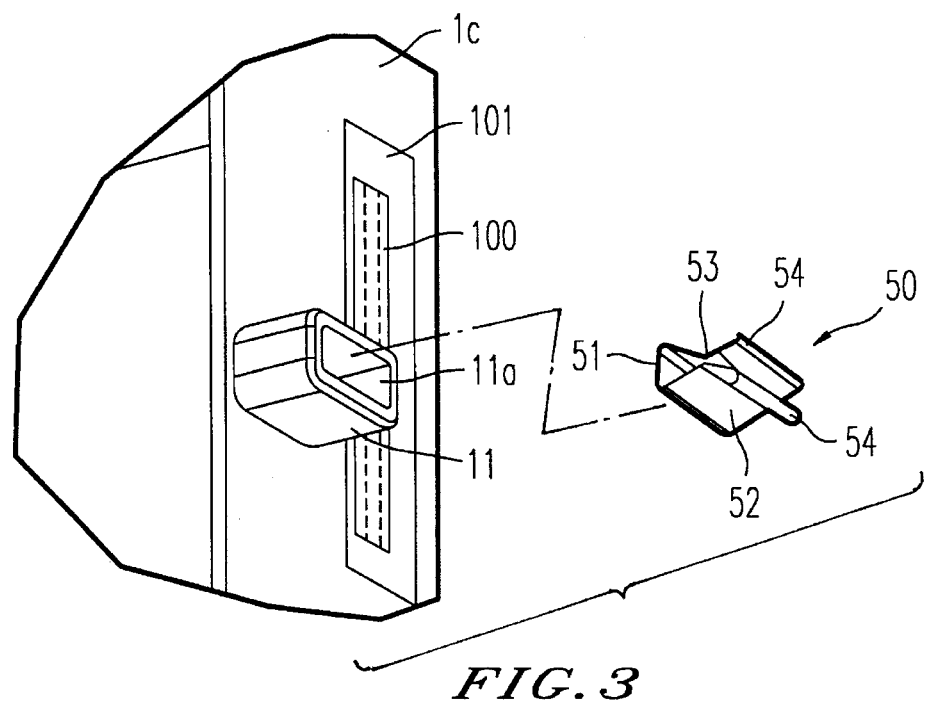
FIG. 3 shows part of the rear part of a module comprising a frame ground connection member and a side view of a metal part that can be associated with this connection member.
Figure 4:
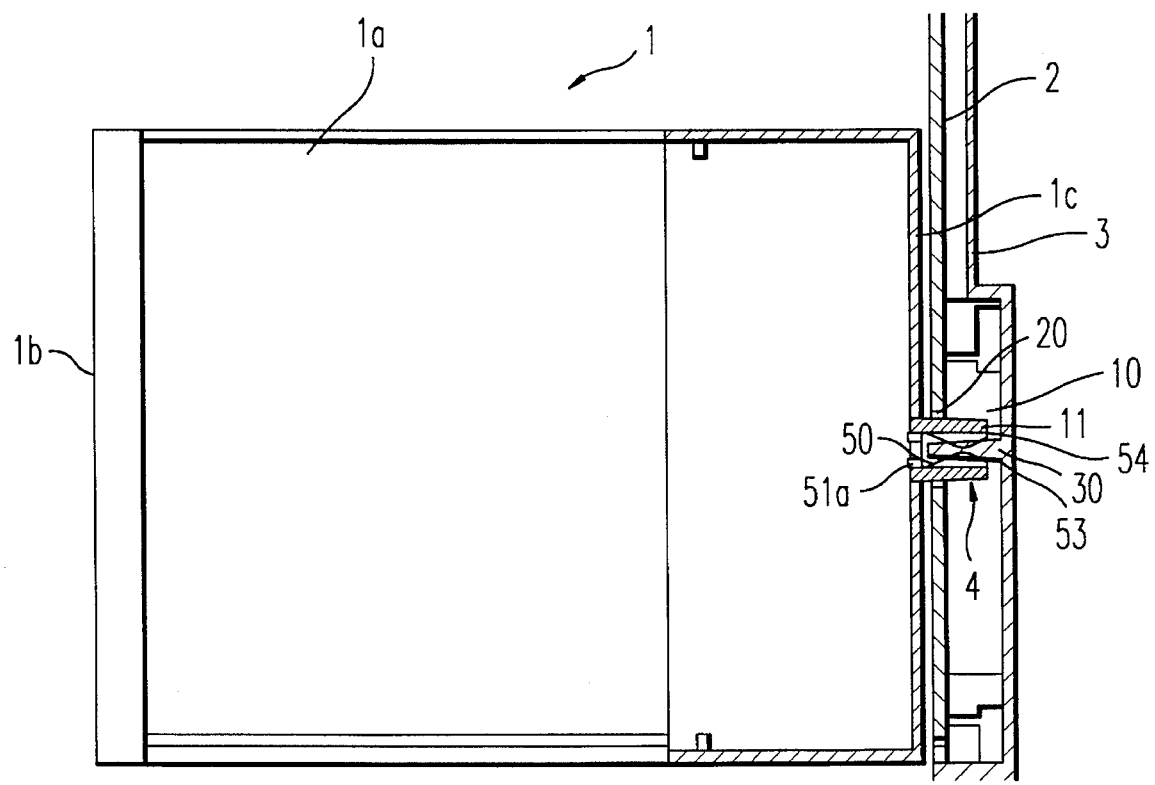
FIG. 4 is a view of the module partly in section on a vertical plane passing through the frame ground connection.

FIGS. 1 and 2 show a plurality of juxtaposed electronic modules M of a programmable automatic controller.

A module comprises a casing 1 with side walls 1a, front wall 1b and a metal rear wall 1c which will also be referred to as the base of the module. It includes processor electronics on a printed circuit card, accommodated in the casing.

The printed circuit is electrically connected on the base side to an interconnect printed circuit 2 via respective connectors 100 and 200.

The interconnect printed circuit is carried by a support 3, for example a metal panel, which is grounded. The interconnect printed circuit includes openings 20.

A frame ground connection device 4 connects a module to the panel, passing through an opening 20 in the interconnect printed circuit, from which it is insulated. The insulation comprises an airgap or a layer of insulative material around the opening.

The device 4 of the invention includes a female member 10 and a male member 30 which cooperate plug-and-socket fashion.

The male member 30 is made of metal and fastened to the panel. It has a finger-like shape and is molded. In a different embodiment the finger member could be attached to the panel, for example by welding.

The member 10 is associated with the module. It includes a metal nose member 11 fastened to the base 1c of the module and a contact part 50 which is inserted into a blind cavity 11a in the nose member.

The nose member 11 is molded and projects to the rear from the base 1c of the module, to one side of an opening 101 provided in the base for the connector 200.

The contact part 50 is a metal part (it is made from bronze, for example) and is U-shape with a core 51, branches 52, elastic constrictions 53 and curved end portions 54.

The core 51 bears on the base 1c of the module casing, which base is connected electrically to a frame ground conductor of the module printed circuit and is therefore at the same potential as the latter.

Each branch 52 has an elastic constriction 53 and a curved end portion 54.

When the contact part is inserted into the nose member, it is held by tongues 51a on the bottom of the core which engage in appropriate openings in the base 1c and then spread apart.

As an alternative to this, the core 51 can be riveted to the base 1c of the module.

The contact part makes the frame ground connection. It connects the module printed circuit electrically to the panel, the core 51 bearing on the base of the module connected electrically to the printed circuit and the finger member of the panel being in contact with the constrictions 53. These constrictions also wedge the finger member into the nose member.

The module is mounted on the support 3 as follows:

The module is moved in translation along an axis parallel to the longitudinal axis of the finger member of the support. The nose member therefore engages on the finger member of the support through the opening 20 in the interconnect circuit. The module can instead move towards the support with a relative pivoting movement.

The association of the male connection member with the female connection member is adapted to maintain the frame ground connection when connecting the module printed circuit to the interconnect printing circuit during mounting and demounting operations. Accordingly the lengths of the nose member and the finger member and the positions of the connectors are such that electrical contact is established between the metal part 50 and the finger member 30 first when connecting the module to the interconnect printed circuit and broken last on disconnection.

In an alternative embodiment to that described above, the nose member can be inside the module and in this case the finger member is longer.

In a further embodiment, the male member can be associated with the module and the female member with the support.

The device 4 of the invention thus ensures frame ground continuity and also fixes the module to the support without using any fixing means such as screws.

There is claimed:

1. A combination of a frame ground connection device and automation equipment which includes at least one removable interface module containing processor electronics on at least one printed circuit adapted to be electrically connected to an interconnect printed circuit carried by a support via respective connectors, said at least one printed circuit being accommodated in a casing of the module and adapted to be fixed to said support and connected electrically to a conductive part of the support by the frame ground connection device which has connecting members fastened to said support and to said module, whereby mutual electrical contact is established between said module and said support, in which device:

said connection members include a male member and a female member adapted to cooperate plug-and-socket fashion, and said interconnect printed circuit includes an opening through which at least one of said connecting members passes when said module is mounted on said support, said member being insulated from said interconnect printed circuit where it passes through said opening.

2. The combination according to claim 1 wherein said female member includes an elastic metal part accommodated in a blind cavity in a rigid metal nose member.

3. The combination according to claim 1 wherein said casing of said module has a metal rear wall and said connection member fastened to said module is cast in one piece with said metal rear wall.

4. The combination according to claim 1 wherein said connection member fastened to said support is a finger member cast in one piece with said support.

5. The combination according to claim 1 wherein the distances between said connection members and between connecting members of said connectors are such that a frame ground connection is established first on connecting said printed circuits of said module to said interconnect printed circuit and interrupted last on disconnection thereof.

\* \* \* \* \*